United States Patent [19]

Spence

[11] Patent Number: 4,804,864

[45] Date of Patent: Feb. 14, 1989

[54] MULTIPHASE CMOS TOGGLE FLIP-FLOP

[75] Inventor: John R. Spence, Villa Park, Calif.

[73] Assignee: Rockwell International Corporation, El Segundo, Calif.

[21] Appl. No.: 23,179

[22] Filed: Mar. 9, 1987

[51] Int. Cl.⁴ .................. H03K 3/26; H03K 3/284; H03K 19/096

[52] U.S. Cl. .................. 307/279; 307/452; 307/272.2

[58] Field of Search .............. 307/279, 272.1, 272.2, 307/443, 452, 451; 377/117, 105, 79, 68

[56] References Cited

U.S. PATENT DOCUMENTS

| | | | |
|---|---|---|---|
| 4,181,862 | 1/1980 | Dingwall | 307/279 |
| 4,275,316 | 6/1981 | Knapp | 307/279 |
| 4,433,357 | 2/1984 | Nishimura et al. | 361/196 |
| 4,484,087 | 11/1984 | Mazin et al. | 307/272.2 |
| 4,506,167 | 3/1985 | Little et al. | 307/279 |
| 4,669,101 | 5/1987 | McCombs | 377/114 |
| 4,680,491 | 7/1987 | Yokouchi et al. | 307/452 |
| 4,691,122 | 9/1987 | Schnizlein et al. | 307/272.2 |

Primary Examiner—John S. Heyman
Assistant Examiner—Timothy P. Callahan
Attorney, Agent, or Firm—H. Fredrick Hamann; David J. Arthur; Tom Streeter

[57] ABSTRACT

A simplified CMOS toggle flip-flop includes a flip-flop that has an input and an output, and a toggle circuit that includes an inverter having an input connected to the flip-flop output, a transfer switch connected between the inverter output and the flip-flop input, and a toggle control responsive to an input toggle signal for closing the transfer switch to connect the inverter output to the flip-flop input to transfer the inverted flip-flop output state to the flip-flop input. The transfer switch may include an NFET having its conduction path connected between the inverter output and the flip-flop input, and having a control gate. The toggle control may include a NAND gate having a first input for receiving a toggle pulse and a second input for receiving a timing pulse, and having an output. A second inverter has an input connected to the NAND gate output and an output connected to the NFET control gate of the transfer switch.

6 Claims, 2 Drawing Sheets

MULTIPHASE CMOS TOGGLE FLIP-FLOP

BACKGROUND OF THE INVENTION

Toggle flip-flops have many uses in CMOS VLSI circuitry. Once a state is imposed on such a flip-flop, that state is stored in the flip-flop so long as the power remains in the flip-flop. When the state of the flip-flop is to be changed, the flip-flop is "toggled" to invert its state.

The flip-flop has two stable states, one of which generally represents a digital "1" and the other of which represents a digital "0". The digital 1 is generally represented by a high voltage VDD (typically 5 volts), and the digital 0 is represented by a low voltage VSS (typically 0 volts or ground).

Flip-flops can be implemented in a number of circuit arrangements. Conventionally, however, such circuits include a large number of components and occupy a relatively large amount of space in the overall device.

The present invention is directed toward providing a small, simple toggle flip-flop circuit for use in circuits employing a clocking scheme having three or more phases.

SUMMARY OF THE INVENTION

The present invention provides a CMOS toggle flip-flop comprising a flip-flop having an input and an output, and a toggle circuit. The toggle circuit includes an inverter having an input connected to the flip-flop output, and having an output. A transfer switch is connected between the inverter output and the flip-flop input. A toggle control responsive to an input toggle signal selectively closes the transfer switch to connect the inverter output to the flip-flop input to apply the inverted flip-flop output to the flip-flop input.

In the preferred form, the transfer switch is an NFET having its conduction path connected between the inverter output and the flip-flop input, and having a control gate. The toggle control preferably includes a NAND gate having a first input for receiving a toggle pulse and a second input for receiving a timing pulse, and having an output. A second inverter has an input connected to the NAND gate output and has an output connected to the NFET control gate.

According to the invention, the flip-flop may be toggled by applying an input state to the flip-flop input, then, during a first time period, propagating that input state to the flip-flop output to establish the flip-flop output state. During a second time period, the flip-flop output state is propagated back to the flip-flop input. The flip-flop output state is also applied to the input of an inverter. During a third time period, the output of the inverter is propagated to the flip-flop input to invert the state of the flip-flop input. During a subsequent repeat of the first time period the new, inverted state of the flip-flop input is propagated to the flip-flop output. The propagating of the output state of the inverter to the flip-flop input includes applying a toggle pulse to the toggle control circuit, and applying a clock pulse to the toggle circuit, during the third time period, then applying the output of the toggle control circuit to the transfer switch to close the transfer switch and connect the output of the inverter to the flip-flop input when the toggle pulse and clock pulse coincide in time.

DETAILED DESCRIPTION OF THE PREFERRED EMBODIMENT

Figure 1:
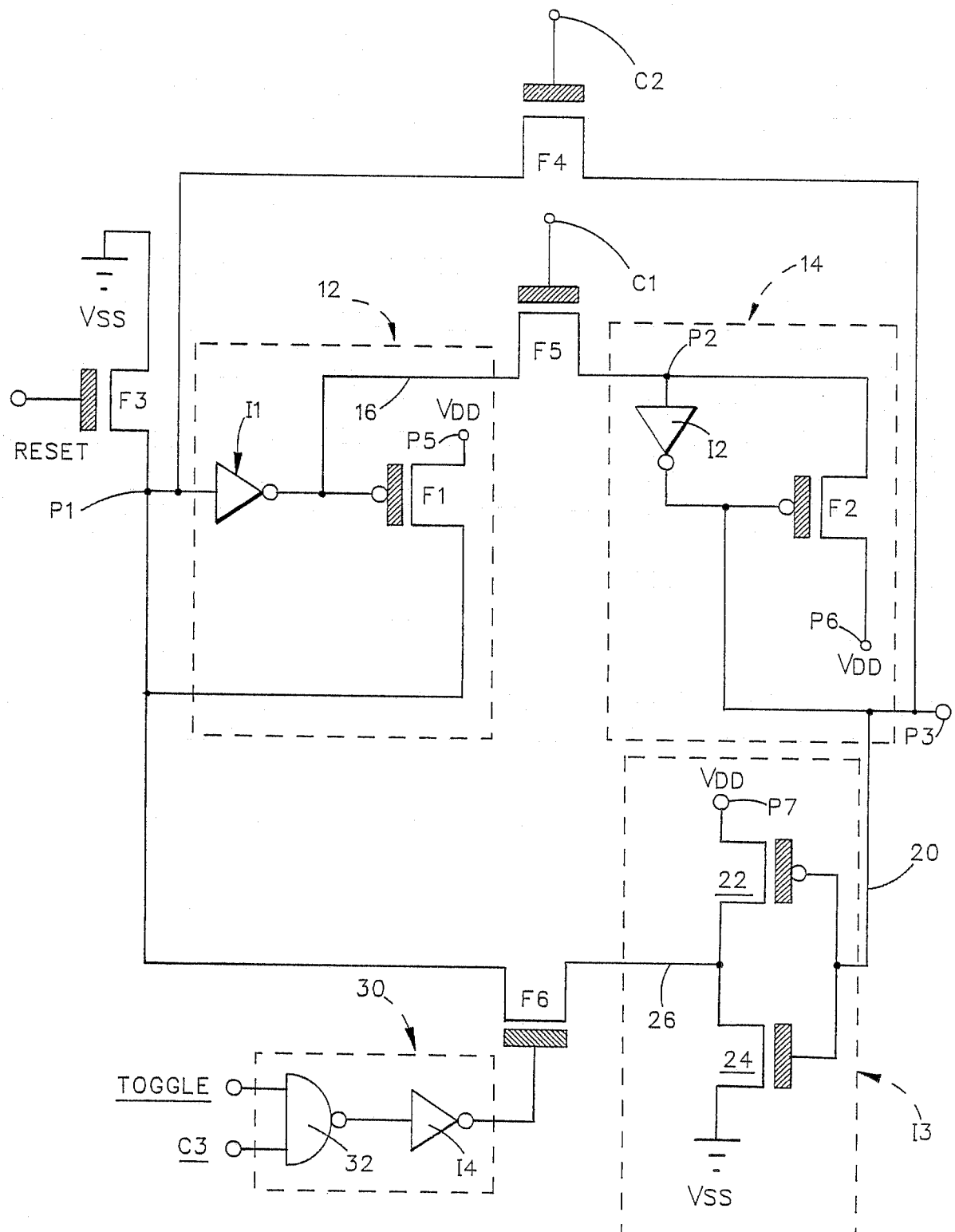
FIG. 1 shows the toggle flip-flop circuit incorporating the invention.
Figure 2:
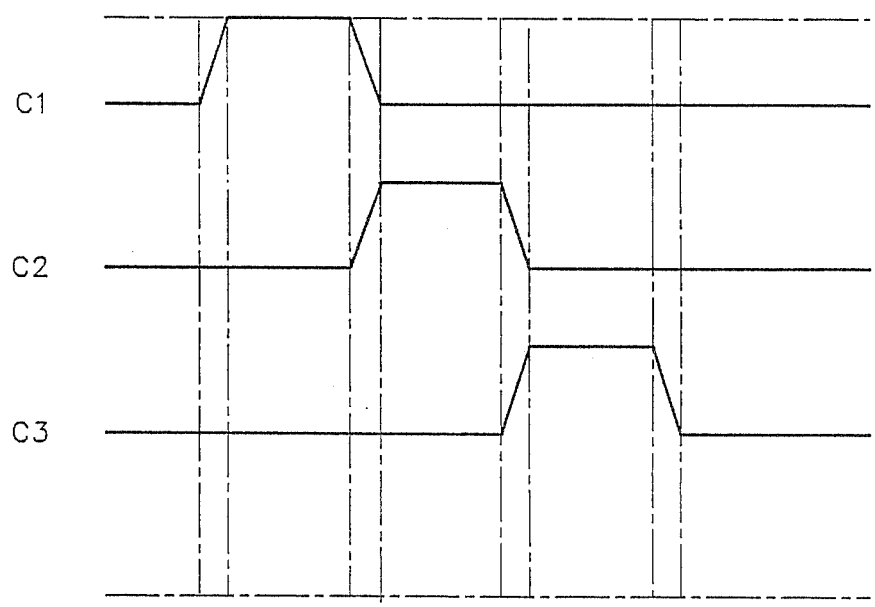
FIG. 2 shows the three timing pulses for operating the circuit shown in FIG. 1.

Referring to FIG. 1, a toggle flip-flop is shown that is considerably simpler than conventional fully static CMOS toggle flip-flops. The toggle flip-flop of the invention uses three clocks, C1, C2, C3, as shown in FIG. 2. Therefore, the device can be used in any three-phase, four-phase, or multi-phase clocking scheme.

The toggle flip-flop includes a flip-flop that consists of two half-stages 12, 14. Each half-stage includes input gating, an inverter, and a PFET feedback line. Such a half-stage is sometimes refferred to as a "half-latch", since the NFET feedback that is typically present is missing.

Connected to or in the flip-flop is a reset NFET F3 having its conduction path connected between a voltage source, such as a low-voltage source VSS (typically ground), and the flip-flop input node, P1. The gate of the NFET 13 is controlled by a reset pulse on the RESET line.

The reset NFET F3 allows a known initial state to be established in the flip-flop. When the signal on the RESET line to the gate of the reset FET F3 goes high, the flip-flop input node P1 is connected to the voltage source VSS and brought to that voltage level.

The flip-flop input node P1 is connected to the input of an inverter I1 in the input half-latch 12. The output of the inverter I1 is connected to the gate of a PFET F1 that connects a high-voltage input terminal P5 that may be connected to a source of high voltage, such as VDD, back to the input node P1. Thus, when the input state applied to the input node P1 is high, the output of the inverter I1 is low, and the PFET F1 is on, causing the high voltage VDD to be applied back to the input node P1 to maintain the high level state on that node. If, however, the state of the input node I1 is low, the output of the inverter I1 is high, so that the PFET F1 is turned off, and the voltage source VDD at the voltage source input node P5 is cut off from the input node I1.

The output of the inverter I1 is also connected to a first half-latch output 16. Thus, the first half-latch output 16 carries the inverse of the flip-flop input P1. The half-latch output is connected to an NFET control switch F5 controlled by a clock pulse C1 to connect the input half-latch 12 with the output half-latch 14. The output half-latch receives the inverse of the state of the flip-flop input P1 at the midpoint node P2.

The output half-latch 14 also includes a second inverter 12 having its input connected to the connection switch F5 and having its output connected to the output node P3. A second PFET F2 has its conduction path connected between a second high voltage input terminal P6 that may be connected to a source of a high voltage, such as VDD, and the input node P2 of the second half-stage. The PFET F2 has its gate connected to the output of the second inverter I2 for control of the PFET. Thus, when the level of the node P2 is high, the PFET F2 is turned on to connect the voltage source VDD to the node P2 and ensure it remains at VDD. Conversely, if the level of the node P2 is low, the PFET F2 is turned off, isolating the high voltage source VDD from the node P2.

The output of the inverter I1 of the second half-latch is also connected to a flip-flop output node P3. The two half-stages 12, 14 permit a state applied to the input node P1 to be propagated to the output node P3 during the clock period C1. For example, if the reset FET F3 has been on for a substantial time so that the input node P1 is at VSS (0 volts), the output of the first half-latch is forced high (to VDD) by the inverter I1. Once the reset signal goes low and NFET F3 turns off, the output of the first inverter I1 remains high and the PFET F1 remains off.

When the clock pulse C1 is applied to the NFET F5, the high voltage on the first half-latch output 16 is applied to the input node P2 of the second half-stage and, thus, to the input of the second inverter I2. The output of the second inverter, therefore, is low. The low output of the second inverter I2 is applied to the flip-flop output node P3 and to the control gate of the PFET F2. That low output causes the PFET F2 to turn on and connect the high voltage source VDD to the node P2 to keep the input of the second inverter high.

The flip-flop also includes an NFET feedback loop including an NFET F4, controlled by a second clock pulse signal C2 and connecting the flip-flop output node P3 with the flip-flop input node P1. The feedback allows the state of the flip-flop output node P3 to be propagated back to the flip-flop input node P1 during the second time pulse, C2. When the clock C2 goes high, the NFET F4 is turned on to connect the output node P3 to the input node P1.

It is not necessary that the pulses C1 and C2 be contiguous, although it is normal for the second pulse C2 to follow immediately after the pulse C1. As long as the clock pulses C1 and C2 occur, the two clocked FEs F4 and F5 will keep either a high state or a low state on the flip-flop nodes P1 and P3. This continuous cycling ensures that whatever degradation in the state may have occured due to leakage is corrected each time the two clock pulses appear.

A toggle circuit allows a toggle control pulse to invert the state of the flip-flop. The toggle circuit includes an inverter I3 having its input 20 connected to the output node P3 of the flip-flop. The inverter I3 preferably includes a PFET 22 and an NFET 24 serially connected between a high voltage input terminal P7 suitable for receiving the high voltage VDD and a low voltage input terminal suitable for receiving the low voltage source VSS. The PFET 22 is connected with its conduction path between the high-voltage input terminal P7 and the inverter output 26, while the NFET 24 has its conduction path connected between the inverter output 26 and the low-voltage input terminal. The gates of both the PFET and the NFET are commonly connected to the inverter input 20. The inverter thus inverts the state of the flip-flop output node P3.

The output 26 of the inverter is connected to a toggle, or transfer, switch, such as an NFET F6. The transfer switch is connected between the output of the inverter I3 and the input node P1 of the flip-flop to provide a connection between the inverter output 26 and the flip-flop input node P1, so the inverted state of the flip-flop output node P3 can be selectively applied to the input node P1.

As previously noted, the state of the output node P3 has been the same as the state of the input node P1. When the transfer switch F6 is closed, the state of the input node P1 is inverted by drawing the voltage on the input node P1 high.

Once the state of the input node I1 has been inverted, the two half-stages of the flip-flop operate during a subsequent repetition of the first clock pulse C1 to propagate that inverted state from the flip-flop input P1 to the flip-flop output node P3, to establish the new inverted state on the input and output nodes P1 and P3 of the flip-flop. With the input node P1 high, the output of the first inverter I1 is low. The PFET F1 is turned on to connect the high voltage source VDD to the flip-flop input P1. During the next succeeding clock pulse C1, that low inverter output is applied to the input node P2 of the second half-latch. The output of the second inverter I2 is high, which high state is transferred to the flip-flop output node P3. The second PFET F2 is turned off to isolate the high voltage source VDD from the node N2. Prior to the clock pulse C1 allowing such a state propagation, the transfer switch F6 will be open because the clock C3 is low, and, therefore, the output of the inverter is low. Thus, there is no connection through the toggle circuit between the output node P3 and the input node P1.

During the subsequent clock pulse C2, the NFET switch F4 is closed to provide a direct feedback connection between the output node P3 and the input node P1 and continue to protect the state of the two nodes P1 and P3.

The toggle transfer switch F6 is controlled by a toggle control circuit 30 that includes a NAND gate 32 and inverter 14. The NAND gate may be a conventional CMOS NAND gate. The inputs to the NAND gate include a toggle control signal TOGGLE that pulses high when the state of the flip-flop is to be toggled, and a clock signal for the clock pulse C3 for the time during which the toggle is to take place. Thus, the output of the NAND gate is normally high at all times except when the toggle control pulse and the clock pulse C3 occur simultaneously.

When the signal TOGGLE and the clock pulse C3 go high simultaneously, the output of the NAND gate goes low. This NAND gate output is connected to the input of the control circuit inverter I4. Thus, the output of the inverter I4 is low at all times except when both the toggle control pulse and the clock pulse C3 occur simultaneously.

When the toggle signal and the clock pulse C3 go high simultaneously, the output of the inverter I4 goes high. The output of the inverter is connected to the control gate for the transfer switch NFET F6 so that the FET F6 is rendered conductive only during the time that the toggle pulse and the clock pulse C3 occur simultaneously.

Thus, the toggle circuit causes the state of the input node P1 to be inverted, overriding the feedback through the feedback NFET F4 during the time C3 when a toggle pulse is received on the toggle control input. Otherwise, so long as the clock pulses C1 and C2 continue, the flip-flop retains its stored state on both the input and output nodes.

I claim:

1. A CMOS toggle flip-flop comprising:
 a flip-flop having an input node and an output node; and
 a flip-flop feedback line connected between said flip-flop output node and said flip-flop input node; and
 a toggle circuit comprising:

an inverter having an input node connected to said flip-flop output node, and having an output node;
a transfer switch connected between said inverter output node and said flip-flop input node; and
a toggle control responsive to an input toggle signal for closing said transfer switch to connect said inverter output node to said flip-flop input node.

2. A CMOS toggle flip-flop comprising:
a flip-flop having an input node and an output node;
a flip-flop feedback line connected between said flip-flop output node and said flip-flop input node; and
a toggle circuit comprising:
   an inverter having an input node connected to said flip-flop output node, and having an output node;
   a transfer switch connected between said inverter output node and said flip-flop input node, said transfer switch comprising a NFET having its conduction path connected beween said inverter output node and said flip-flop input node, and having a control gate; and
   a toggle control responsive to an input toggle signal for closing said transfer switch to connect said inverter output node to said flip-flop input node, said toggle control comprising:
      a NAND gate having a first input node for receiving a toggle pulse and a second input node for receiving a timing pulse, and having an output node; and
      a second inverter having an input node connected to said NAND gate output node and having an output node connected to said NFET control gate.

3. A CMOS toggle flip-flop comprising:
a flip-flop having an input node and an output node and comprising:
   circuitry responsive to a first clock pulse to transfer the signal level at said flip-flop input node to said flip-flop output node; and
   circuitry responsive to a second clock pulse to transfer the signal level at said flip-flop output node to said flip-flop input node; and
a toggle circuit for toggling the state of said flip-flop, comprising:
   an inverter having an input node connected to said flip-flop output node, and having an output node;
   a transfer FET having its conduction path connected between said inverter output node and said flip-flop input node; and
   a toggle control connected to the gate of said transfer FET and responsive to an input toggle signal and to a third clock pulse for causing said transfer FET to connect said inverter output node to said flip-flop input node to invert the signal level at said flip-flop input node.

4. A method of toggling a flip-flop, comprising:
applying an input signal level to a flip-flop input node;
during a first time period propagating said input signal level to a flip-flop output node to establish a flip-flop output signal level;
during a second time period propagating said flip-flop output signal level to said flip-flop input node;
applying said flip-flop output signal level to an input node of an inverter;
during a third time period propagating the signal level at output node of said inverter to said flip-flop input node to invert the signal level at said flip-flop input node; and
during a fourth time period propagating said inverted flip-flop input signal level to said flip-flop output.

5. The method of claim 4 wherein said step of propagating the inverter output signal level to said flip-flop input node comprises:
applying a toggle pulse to a toggle control circuit;
applying a clock pulse to said toggle control circuit during said third time period; and
applying an output signal from said toggle control circuit to a transfer switch to close said transfer switch and connect the output node of said inverter to said flip-flop input node when said toggle pulse and saide clock pulse coincide in time.

6. The method of Claim 5 wherein said transfer switch comprises an NFET having its conduction path connected between said inverter output node and said flip-flop input node, and having its gate connected to an output node of said toggle control circuit, wherein said step of applying the output signal from said toggle control circuit to said transfer switch comprises:
applying said toggle pulse and said clock pulse to a NAND gate;
applying the output of said NAND gate to the input node of a second inverter; and
applying an output signal from said second inverter to said transfer switch NFET gate.

* * * * *